United States Patent [19]

Brodie

[11] 4,302,689
[45] Nov. 24, 1981

[54] SAMPLE AND HOLD CIRCUIT

[75] Inventor: Benjamin T. Brodie, Edmonds, Wash.

[73] Assignee: John Fluke Mfg. Co., Inc., Mountlake Terrace, Wash.

[21] Appl. No.: 62,922

[22] Filed: Aug. 2, 1979

[51] Int. Cl.³ .............................................. G11C 27/02
[52] U.S. Cl. .................................... 307/353; 328/151; 328/162; 307/359
[58] Field of Search ....................... 307/352, 353, 359; 328/151, 162

[56] References Cited

U.S. PATENT DOCUMENTS

| | | | |
|---|---|---|---|
| 3,516,002 | 6/1970 | Hillis | 328/151 X |
| 3,568,085 | 3/1971 | Pimenoff | 328/151 X |
| 3,654,560 | 4/1972 | Cath et al. | 307/359 X |
| 3,696,305 | 10/1972 | Mitchell et al. | 307/353 X |

Primary Examiner—John Zazworsky
Attorney, Agent, or Firm—Christensen, O'Connor, Johnson & Kindness

[57] ABSTRACT

A sample and hold (S/H) circuit that produces an output signal having essentially zero offset voltage error is disclosed. The S/H circuit includes a pair of operational amplifiers (OA3 and OA4) that are connected in circuit during both the sample and the hold modes of operation. In the sample mode of operation one of the operational amplifiers (OA3) receives the incoming signal through a first resistor (R1) and in accordance therewith controls the magnitude of an inverted voltage stored on a storage capacitor (C1); and, the other operational amplifier (OA4) senses the stored inverted voltage and, in accordance therewith, applies a feedback voltage to the signal input of OA3 through a second resistor (R2). In the hold mode of operation OA4 senses the voltage stored on C1 and, in accordance therewith, via R2 and OA3 controls the output voltage, which has the correct polarity due to the inverted voltage being inverted by OA3. In addition, during the hold mode of operation, the output voltage is fed back through R1 to the input of OA3 receiving the output of OA4. If the resistance of R1 equals the resistance of R2, the magnitude of the voltage stored by C1 is equal to the input signal voltage. If the resistance ratio of R2 to R1 is greater than one, the magnitude of the stored voltage is greater than the input signal voltage, even though the output voltage is equal to the input signal voltage. Storing a higher level voltage reduces the effect of capacitor leakage and OA4 drawing current from C1 on the output voltage.

10 Claims, 3 Drawing Figures

SAMPLE AND HOLD CIRCUIT

TECHNICAL AREA

This invention is directed to electronic storage devices and, more particularly, electronic sample and hold circuits.

BACKGROUND OF THE INVENTION

A wide variety of sample and hold (S/H) circuits have been developed for use in electronic systems. S/H circuits have two modes of operation—a sample mode during which the S/H circuit tracks the voltage applied to its input; and, a hold mode during which the S/H circuit stores the input voltage that occurred immediately proceeding the time the S/H circuit is switched from its sample mode to its hold mode of operation.

One of the major disadvantages of prior art S/H circuits is that the output produced during the hold mode of operation includes an offset voltage error. The offset voltage error occurs because prior art S/H circuits generally do not connect in circuit both of the operational amplifiers included in such circuits during both the sample mode of operation and the hold mode of operation. More specifically, the main elements of a typical prior art sample and hold circuit include a pair of operational amplifiers, a storage capacitor, electronic switches and one or more resistors. The electronic switches are positioned in the circuit such that during the sample mode of operation, both of the operational amplifiers are connected in circuit. Usually one of the operational amplifiers applies the input voltage to the capacitor and the other operational amplifier senses the voltage on the capacitor and produces a feedback signal that is applied to the first operational amplifier. During the hold mode of operation, the second operational amplifier senses the voltage on the capacitor and produces an output signal. The first operational amplifier is not connected in circuit. The end result of this arrangement is that the output voltage produced during the hold mode of operation includes an offset voltage produced by the first operational amplifier, said offset voltage creating an error in the output voltage. Obviously errors in signals are undesirable. Thus, there is a need for a sample and hold circuit that eliminates this source of error. That is, there is a need for a sample and hold circuit that has substantially zero offset voltage error.

Therefore, it is an object of this invention to provide a new and improved sample and hold circuit.

It is another object of this invention to provide a sample and hold circuit that has essentially zero offset voltage error in its output.

It is a still further object of this invention to provide a relatively uncomplicated sample and hold circuit that has essentially zero offset voltage error in the output signal produced by the circuit during the hold mode of operation.

Another disadvantage of prior art sample and hold circuits is the error that occurs in the output signal as a result of the storage capacitor leaking charge and as a result of the current drawn from the capacitor by the operational amplfier producing the output voltage during the hold mode of operation. Such errors become of particular significance when the sample and hold circuit is placed in the hold mode of operation for a relatively long period of time, because these effects are cumulative.

Therefore, it is a further object of this invention to provide a sample and hold circuit wherein the effect of capacitor charge leakage is reduced.

It is yet another object of this invention to provide a sample and hold circuit wherein the effect on the output voltage of the S/H circuit caused by the output operational amplifier drawing current from the capacitor during the hold mode of operation is reduced.

SUMMARY OF THE INVENTION

In accordance with this invention, a sample and hold (S/H) circuit that produces an output signal having essentially zero offset voltage error is provided. The S/H circuit includes a pair of operational amplifiers that are connected in circuit during both the sample and the hold modes of operation. During the sample mode of operational, one of the operational amplifiers receives the input signal and, in accordance therewith, controls the magnitude of an inverted voltage stored on a capacitor. At the same time, the other operational amplifier senses the stored capacitor voltage and applies a corresponding feedback voltage to the signal input of the first operational amplifier. During the hold mode of operation the second operational amplifier senses the voltage stored on the capacitor and in accordance therewith controls, via the first operational amplifier, the output voltage. In addition, during the hold mode of operation, the output voltage is fed back to the input of the first operational amplifier. During the hold mode, the first operational amplifier inverts the inverted voltage so that the output voltage has the same polarity as the originally sampled input voltage.

In the preferred embodiment of the invention, during the sample mode of operation the first operational amplifier receives the input signal through a first resistor and the feedback signal (produced by the second operational amplifier) through a second resistor. During the hold mode of operation, the first operational amplifier receives the stored voltage through the second resistor and the output feedback signal through the first resistor. If the ratio of the second resistor to the first resistor is chosen to be equal to one, the magnitude of the voltage stored on the capacitor is equal (but of opposite polarity) to the voltage of the input signal received during the sample mode of operation. Contrariwise, if the ratio of the second resistor to the first resistor is greater than one, the magnitude of the stored voltage is greater than the value of the input signal voltage. Even though the magnitude of the stored voltage is higher than the input voltage, because of the resistance arrangement, the output voltage produced during the hold mode of operation is equal to the input signal voltage. More specifically, the input signal voltage received during the sample period of time is multiplied by a factor equal to the ratio of the second resistor to the first resistor and the result stored on the capacitor. During the hold mode of operation, the stored voltage is divided by the same factor.

It will be appreciated from the foregoing summary that the invention provides a new and improved sample and hold circuit. The sample and hold circuit has essentially zero offset voltage error because both operational amplfiers are connected in circuit during both the sample and hold modes of operation, whereby their offset voltages, in essence, cancel during both modes of operation. As noted, the use of a resistance ratio greater than one results in the voltage stored on the capacitor being substantially higher than the input signal voltage. As a result, leakage currents and currents drawn by the second operational amplifier during the hold mode of operation have substantially less effect on the output voltage than these items would have if the stored voltage is made equal to the input signal voltage.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENT

Figure 1:
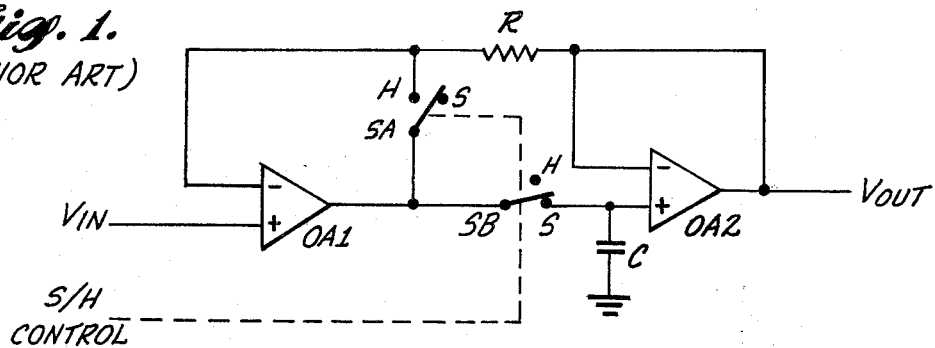
FIG. 1 is a schematic diagram of a prior art type of sample and hold circuit.

FIG. 1 is a block diagram of a typical prior art sample and hold (S/H) circuit and includes: two operational amplifiers designated OA1 and OA2; a capacitor designated C; a resistor designated R; and, a pair of switches designated SA and SB. SA and SB are illustrated as a ganged pair of single pole, double throw mechanical switches for purposes of illustration simplification. As will be readily appreciated by those skilled in the sample and hold circuit art, in actual sample and hold circuits SA and SB are usually formed by semiconductor switches. In any event, as illustrated, SA and SB have a common terminal and two remote terminals. The remote terminals are designated sample (S) and hold (H). While illustrated as single pole, double throw switches, the S terminal of SA is unconnected and the H terminal of SB is unconnected. When the S/H circuit illustrated in FIG. 1 is in a sample mode of operation the S terminals of SA and SB are connected to their common terminals. In the hold mode of operation the H terminals of SA and SB are connected to their common terminals.

The input signal, $V_{IN}$, applied to the S/H circuit illustrated in FIG. 1 is applied to the noninverting terminal of OA1. The output of OA1 is connected to the common terminals of SA and SB. The H terminal of SA is connected to the inverting input of OA1. The S terminal of SB is connected through C to ground and to the noninverting terminal of OA2. The output of OA2 is connected to the inverting input of OA2 and through R to the H terminal of SA. A S/H control signal, as illustrated by the dashed line, controls the position of SA and SB. Finally, the output, $V_{OUT}$, of the S/H circuit illustrated in FIG. 1 occurs at the output of OA2.

In the sample mode of operation (SA and SB in position), $V_{IN}$, via OA1 and SB, controls the voltage on C. $V_{OUT}$ is fed back to OA2; and, through R to OA1. As a result, both OA1 and OA2 are connected in circuit during the sample mode of operation.

During the hold mode of operation (SA and SB in H position), the voltage on C directly controls $V_{OUT}$. In essence, during the hold mode of operation, OA1 is switched out of the circuit and only OA2 is used. As a result, $V_{OUT}$ has an offset voltage error equal to the offset voltage of OA1. In many instances, the offset voltage error must be compensated for by downstream circuitry. The present invention is directed to producing a $V_{OUT}$ that has substantially zero offset voltage error, whereby compensation by downstream circuitry is no longer required.

Another problem with prior S/H art circuits of the type illustrated in FIG. 1 is that the voltage on C dissipates with time. Part of the voltage loss is caused by capacitor leakage current. Another portion of the voltage loss results from the input current drawn by OA2. That is, while OA2 draws very little current from C, it does draw some finite amount of current. Since both leakage currents and the input current drawn by OA2 are cumulative, if the sample and hold circuit is required to remain in the hold state for a relatively long period of time, these currents create a further significant error in $V_{OUT}$. The invention is also directed to reducing the effect on $V_{OUT}$ of capacitor leakage current and the input current drawn by OA2.

Figure 2:
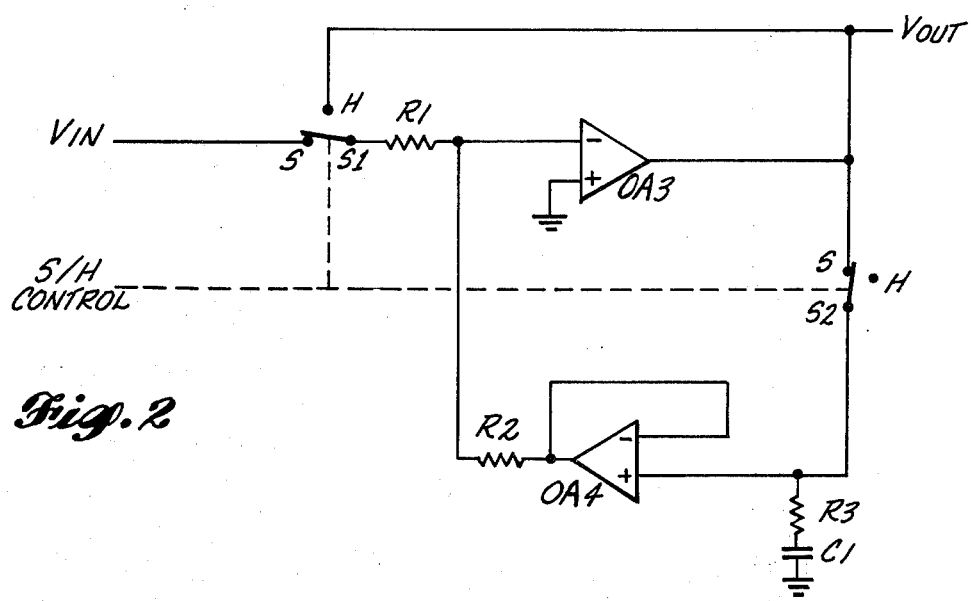
FIG. 2 is a schematic diagram of a preferred embodiment of the invention.

FIG. 2 is a block diagram of a preferred embodiment of the invention and includes: two operational amplifiers designated OA3 and OA4; three resistors designated R1, R2 and R3; a capacitor designated C1; and, two switches designated S1 and S2. As in FIG. 1, S1 and S2 are illustrated as single pole, double throw mechanical switches. However, in an actual embodiment of the invention S1 and S2 would take the form of semiconductor switches. For example, S1 and S2 could be formed by field effect transistor switches. In any event, as illustrated, S1 and S2 each include a common terminal and a pair of remote terminals. The remote terminals are designated sample (S) and hold (H). S1 and S2 are illustrated as ganged together and controlled by a common S/H control signal such that the common terminals of both switches are connected to the same remote terminal.

$V_{IN}$ is applied to the S terminal of S1. The common terminal of S1 is connected through R1 to the inverting input of OA3. The noninverting input of OA3 is connected to ground. The output of OA3 is connected to the H terminal of S1. The output of the S/H circuit illustrated in FIG. 2 occurs on the output of OA3 and is designated $V_{OUT}$. Finally, the output of OA3 is connected to the S terminal of S2. The H terminal of S2 is unconnected. The common terminal of S2 is connected to one end of R3. The other end of R3 is connected through C1 to ground. The common terminal of S2 is also connected to the noninverting input of OA4. The output of OA4 is connected to the inverting input of OA4 and through R2 to the inverting input of OA3. Thus, OA3 is connected as an inverting amplifier and OA4 is connected as a buffer or follower amplifier.

During the sample mode of operation (S1 and S2 in S position), $V_{IN}$ is applied through R1 to OA3 to control the voltage on C1. The polarity of the voltage with respect to the polarity of $V_{IN}$ is inserted. In addition, the inverted voltage on C1 is fed back to OA3 via OA4. As a result, the inverted voltage on C1 is equal or proportional to $V_{IN}$, depending upon the ratio of R2 to R1. The important thing to note is that both OA3 and OA4 are connected in circuit during the sample mode of operation.

During the hold mode of operation (S1 and S2 in H position), the inverted voltage on C1 is applied via OA4 to the input of OA3, as in the sample mode of operation. OA3 inverts this input and produces a $V_{OUT}$ that is fed back through R1 to the common input of OA3. Thus, both the stored voltage (which is of one polarity) and the output voltage (which is of the opposite polarity)

are summed at the inverting input of OA3. As a result, $V_{OUT}$ is equal or proportional to the voltage on C1, depending upon the ratio of R2 to R1. R1 and R2 are positioned in the circuit such that the proportionality constant during the sample and hold modes of operation is the same. During the sample mode of operation $V_{IN}$ is multiplied by the proportionality constant and during the hold mode of operation the capacitor voltage is divided by the proportionality constant. Thus, $V_{OUT}$ (hold) is equal to $V_{IN}$ (sample). Further, $V_{OUT}$ (hold) has the same polarity as $V_{IN}$(sample). Again, the important thing to note is that both OA3 and OA4 are connected in circuit during the hold mode of operation.

As will be better understood from the following description, the inclusion of OA3 and OA4 in circuit during both the sample and hold modes of operation results in a hold mode output voltage that, in essence, has zero offset voltage error.

Figure 3:
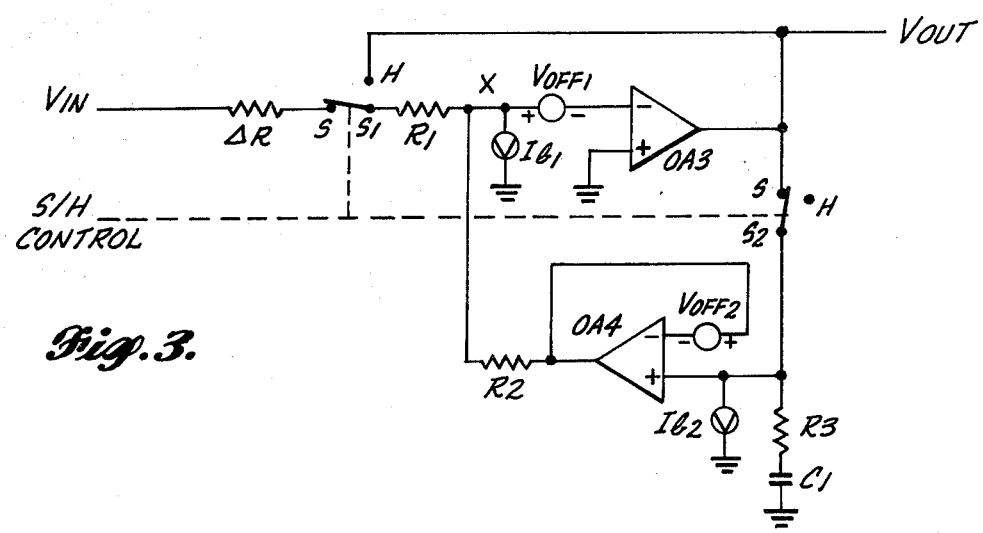
FIG. 3 is a schematic diagram of the preferred embodiment of the invention illustrated in FIG. 2 modified to show the most significant offset voltages and input bias circuits.

In addition to including the embodiment of the invention illustrated in FIG. 2, FIG. 3 also illustrates the major offset voltages and the most significant input bias currents that need to be considered in analyzing the preferred embodiments of the invention illustrated in FIG. 2. In this regard, a first offset voltage designated $V_{OFF1}$ is illustrated at the inverting input of OA3. A second offset voltage designated $V_{OFF2}$ is illustrated at the inverting input of OA4. A first input bias current designated $I_{b1}$ is illustrated at the inverting input of OA3 and a second input bias current designated at $I_{b2}$ is illustrated at the noninverting input of OA4. In addition, the circuit illustrated in FIG. 3 includes the internal resistance of S1 when S1 is in the S position. This resistance is denoted $\Delta R$. The remaining offset voltage, input bias current and switch resistance values are such that they have little or no effect on the operation of the circuit. Thus, for practical reasons they are ignored in the following analysis.

Turning now to an analysis of the circuit illustrated in FIG. 3, summing the currents at point X (the junction between R1, R2 and the inverting input of OA3), when the preferred embodiment of the invention is in the sample mode of operation, results in the following equation:

$$I_{b1S} = \frac{V_{IN} - V_{OFF1S}}{R1 + \Delta R} + \frac{V_{OUTS} + V_{OFF2S} - V_{OFF1S}}{R2} \quad (1)$$

where the additional subscript S denotes the sample mode of operation.

Rearranging the terms of equation (1) results in the following equation:

$$V_{OUTS} = \frac{-V_{IN}R2}{R1 + \Delta R} + V_{OFF1S}\left[1 + \frac{R2}{R1 + \Delta R}\right] - V_{OFF2S} + I_{b1S}R2 \quad (2)$$

Summing the currents at junction X, when the circuit illustrated in FIG. 3 is in the hold mode of operation, results in the following equation:

$$I_{b1H} = \frac{V_{STORED} + V_{OFF2H} - V_{OFF1H}}{R2} + \frac{V_{OUTH} - V_{OFF1H}}{R1} \quad (3)$$

where the additional subscript H denotes the hold mode of operation.

Rearranging the terms of the equation (3) results in the following equation:

$$V_{STORED} = \frac{-V_{OUTH}R2}{R1} - V_{OFF2H} + V_{OFF1H}\left[1 + \frac{R2}{R1}\right] + I_{b1H}R2 \quad (4)$$

Since $V_{STORED}$ equals $V_{OUTS}$ when the preferred embodiment of the invention is in the hold mode of operation, equation (2) and (4) can be set equal to each other, whereby the following equation is developed:

$$\frac{V_{OUTH}R2}{R1} - V_{OFF2H} + V_{OFF1H}\left[1 + \frac{R2}{R1}\right] + I_{b1H}R2 = \\ -\frac{V_{IN}R2}{R1 + \Delta R} + V_{OFF1S}\left[1 + \frac{R2}{R1 + \Delta R}\right] - \\ V_{OFF2S} + I_{b1S}R2 \quad (5)$$

If it is assumed that the operational amplifiers are not considerably hotter in the sample mode of operation than in the hold mode of operation and that the value of R3 is adequate to insure that the current, supplied by OA3 when C1 is charged, is not adequate to overheat OA3, the following relationships exist:

$$V_{OFF1S} = V_{OFF1H} = V_{OFF1} \quad (6)$$

$$V_{OFF2S} = V_{OFF2H} = V_{OFF2} \quad (7)$$

$$I_{b1S} = I_{b1H} = I_{b1} \quad (8)$$

As a result equation (5) can be reduced to the following equation:

$$-V_{OUTH}\left[\frac{R2}{R1}\right] - V_{OFF2} + V_{OFF1}\left[1 + \frac{R2}{R1}\right] + I_{b1}R2 = \\ -\frac{V_{IN}R2}{R1 + \Delta R} + V_{OFF1}\left[1 + \frac{R2}{R1 + \Delta R}\right] - V_{OFF2} + I_{b1}R2 \quad (9)$$

Multiplying both sides of equation (9) by $-R1/R2$ results in a following equation:

$$V_{OUTH} + V_{OFF2}\left[\frac{R1}{R2}\right] - V_{OFF1}\left[\frac{R1}{R2} + 1\right] - I_{b1}R1 = \\ \frac{V_{IN}R1}{R1 + \Delta R} - V_{OFF1}\left[\frac{R1}{R2} + \frac{R1}{R1 + \Delta R}\right] + \\ V_{OFF2}\left[\frac{R1}{R2}\right] - I_{b1}R1 \quad (10)$$

Rearranging the terms of equation (10) results in the following equation:

$$V_{OUTH} = V_{IN}\left[\frac{R1}{R1 + \Delta R}\right] + \quad (11)$$

$$V_{OFF1}\left[\frac{R1}{R2} + 1 - \frac{R1}{R2} - \frac{R1}{R1 + \Delta R}\right] +$$

$$V_{OFF2}\left[\frac{R1}{R2} - \frac{R1}{R2}\right] + I_{b1}[R1 - R1]$$

Since the terms inside of the brackets of the last two expressions of equation (11) are equal to zero, equation (11) can be reduced to:

$$V_{OUTH} = V_{IN}\left[\frac{R1}{R1 + \Delta R}\right] + V_{OFF1}\left[\frac{\Delta R}{R1 + \Delta R}\right] \quad (12)$$

If it is assumed that R1 is much, much greater than $\Delta R$, equation (12) can be reduced to:

$$V_{OUTH} = V_{IN}\left[1 - \frac{\Delta R}{R1}\right] + V_{OFF1}\frac{\Delta R}{R1} \quad (13)$$

If it is now assumed that $\Delta R$ is equal to zero, which means that S1 is a perfect switch, equation (13) further reduces to:

$$V_{OUTH} = V_{IN} \quad (14)$$

In other words, the output voltage during the hold mode of operation is equal to $V_{IN}$ at the end of the sample mode of operation.

In addition to the assumptions noted above, of course, it is assumed that the gain of the amplifiers is infinite. In this regard, a detailed analysis of the foregoing circuitry, including noninfinite amplifier gain, can be performed to show that the output voltage is equal to the input voltage regardless of amplifier gain, if R1 equals R2 and $\Delta R$ equals zero. More specifically, if amplifier gain is included in the analysis of the preferred embodiment of the invention, $V_{OUTH}$ can be expressed by the following equation:

$$V_{OUTH} = V_{IN}\left[\frac{R1}{R1 + \Delta R}\right] + V_{OFF1}\frac{\Delta R}{R1} + \quad (15)$$
$$\frac{V_{OUTH}}{A1}\left[\frac{R2}{R1}\left(1 - \frac{\Delta R}{R1}\right) - \frac{R1}{R2}\right]$$

where A1 is the gain of OA3 and the other terms are as previously described.

If R1 is set equal to R2 and $\Delta R$ is set equal to zero, equation (15) reduces to equation (14).

If it is now assumed that R1 is not equal to R2 and OA3 has a finite amplifier gain of $10^6$ and $\Delta R$ is equal to zero, equation (15) reduces to $$V_{OUTH} = V_{IN} + \frac{V_{OUTH}}{10^6}\left[\frac{(R2)^2 - (R1)^2}{R1\,R2}\right] \quad (16)$$

If R2 is set equal to 5R1, then equation (16) becomes:

$$V_{OUTH} = V_{IN} + \frac{5V_{OUTH}}{10^6} \quad (17)$$

Which can be reduced to:

$$V_{OUTH} = \frac{V_{IN}}{1 - 5 \times 10^{-6}} \quad (18)$$

If it is now assumed that $\Delta R$ has some finite value that can be adjusted, OA3 has a finite value of $10^6$ and R2 is equal to 5R1, equation (15) reduces to:

$$V_{OUTH} = V_{IN}\left[1 - \frac{\Delta R}{R1}\right] + \frac{5V_{OUTH}}{10^6} + V_{OFF1}\left[\frac{\Delta R}{R1}\right] \quad (19)$$

Collecting and rearranging the terms of the equation (19) results in the following equation:

$$V_{OUTH} = V_{IN}\frac{\left[1 - \frac{\Delta R}{R1}\right]}{\left[1 - \frac{5}{10^6}\right]} + V_{OFF1}\frac{\Delta R}{R1\left[1 - \frac{5}{10^6}\right]} \quad (20)$$

Since $\Delta R$ is adjustable, it can be adjusted such that $V_{OUTH}$ is equal to $V_{IN}$.

When $\Delta R$ is adjusted in this manner, equation (20) becomes:

$$V_{IN} = V_{IN}\frac{\left[1 - \frac{\Delta R}{R1}\right]}{\left[1 - \frac{5}{10^6}\right]} + V_{OFF1}\frac{\Delta R}{R1\left[1 - \frac{5}{10^6}\right]} \quad (21)$$

Rearranging the terms of equation (21) results in:

$$V_{IN}\left[1 - \frac{5}{10^6} - 1 + \frac{\Delta R}{R1}\right] = V_{OFF1}\frac{\Delta R}{R1} \quad (22)$$

Equation (22) can be reduced to the following equation:

$$\frac{V_{OFF1}}{V_{IN}} = \frac{\frac{\Delta R}{R1} - \frac{5}{10^6}}{\frac{\Delta R}{R1}} = \frac{1 - \left[\frac{R1}{\Delta R}\right]\left[\frac{5}{10^6}\right]}{1} \quad (23)$$

In terms of $\Delta R$ and R1 equation (23) can be changed in form to the following equation:

$$\frac{\Delta R}{R1} = \frac{5 \times 10^{-6}}{1 - \frac{V_{OFF1}}{V_{IN}}} \quad (24)$$

Since the ratio of $V_{OFF1}$ to $V_{IN}$ is typically in the 1:100 range, equation (24) is approximately equal to $5 \times 10^{-6}$. Since $V_{OFF1}$ is multiplied by $\Delta R/R1$ as shown in equation 20, the resultant offset voltage appearing in the output is reduced by the factor of $\Delta R/R1$ or 5 times $10^{-6}$ using the gain and R2/R1 ratio denoted above. Thus, for a typical 10 mV amplifier offset voltage, the output offset error seen with R2/R1 ratio equal to 5 and an OA3 gain of $10^6$ is $50 \times 10^{-9}$ volts. Clearly, this effect is negligible. Therefor, for a finite gain amplifier using R2/R1=5 and an adjustment for $\Delta R$, the output voltage can be made equal to the input voltage with no offset voltage effect appearing. It should be noted that the bandwidth of amplifier OA3 must be less than the bandwidth of amplifier OA4 for the preferred embodiment of the invention to operate satisfactorily. Of course, amplifier OA4 should have low input current requirements. In many instances R3 may be eliminated. If included R3 should have a value that reduces the self heating of amplifier OA3. R3 also has the desirable effect of attenuating any AC noise on $V_{IN}$.

The only assumption in the foregoing analysis that could affect the amount of output error is the assumption that $V_{STORED}$ is equal to $V_{OUTS}$. In this regard, $V_{STORED}$ differs from $V_{OUTS}$ by the amount that C discharges with time due to leakage current and due to the amount of current drawn by OA4. These effects are represented by $I_{b2}$ in FIG. 3. More specifically the change in stored voltage with respect to time ($\Delta t$) is given by:

$$\Delta V_{STORED} = \frac{I_{b2}\Delta t}{C1} \qquad (25)$$

In terms of fractional error, with respect to $V_{STORED}$ equation (25) can be divided by $V_{STORED}$ to create the following equation:

$$\frac{\Delta V_{STORED}}{V_{STORED}} = \frac{I_{b2}\Delta t}{V_{STORED}\,C1} \qquad (26)$$

Since:

$$V_{STORED} \approx V_{IN}\frac{R2}{R1} \qquad (27)$$

Equation (26) can be changed to:

$$\frac{\Delta V_{STORED}}{V_{STORED}} = \frac{I_{b2}\Delta t\, R1}{V_{IN}\, C1\, R2} \qquad (28)$$

It will be appreciated from equation (28) that the error due to $I_{b2}$ can be made small by making the ratio of R1 to R2 small. By a judicious choice of the values of R1 and R2, an order of magnitude improvement in drift can be achieved utilizing the invention. Practically, this means, that the circuit can be placed in a hold mode of operation for a relatively long period of time without $V_{OUT}$ being degraded by an undesirable amount due to leakage current and the input current drawn by OA4.

It is pointed out that the invention is not sensitive to offset currents in either amplifier. The invention is not sensitive to such currents because the effect of the actual input current on OA3 is cancelled. The effect of the offset current $I_{b2}$ only has an effect on the discharge of the capacitor with time. $I_{b2}$ has no independent effect.

It will be appreciated from the foregoing description that the invention provides a new and improved sample and hold circuit. The circuit has substantially zero offset voltage error whereby downstream circuitry does not have to compensate for offset voltage errors. In addition, by the judicious choice of the value of two resistors included in the circuit, the effect of leakage current and current drawn by the operational amplifier connected to the storage capacitor during the hold mode of operation, is reduced. As a result, the sample and hold circuit of the invention is ideally suited for use in circuits where the sample and hold circuit is required to hold a sample voltage for a substantial period of time.

While a preferred embodiment of the invention has been illustrated and described, it will be appreciated that various changes can be made therein without departing from the spirit and scope of the invention. For example, while field effect transistor switches are the preferred form of the switches used to carry out the functions of S1 and S2, obviously other types of switches can be utilized, if desired. Further S1 can be placed between R1 and the junction between R2 and the inverting input of OA3 (rather than between the input terminal and R1 as illustrated in FIGS. 2 and 3) and a resistor having a resistance value equal to the value of R1 inserted in the path connecting the output of OA3 to the H terminal of S1. Or, this circuit can be modified such that S1 is split into two switches, one located between R1 and the input terminal and the other located in the path connecting the additional resistor between the output of OA3 and its inverting input. Still further S1 can be replaced by a pair of switches connected in parallel with, and on opposite sides of the resistor of a potentiometer whose variable voltage terminal is connected to RI. Hence, the invention can be practiced otherwise than as specifically described herein.

The embodiments of the invention in which an exclusive property or privilege is claimed are defined as follows:

1. A sample and hold circuit having substantially zero offset voltage error comprising:
   an input terminal;
   first amplifier means having at least one input and an output;
   first switch means for connecting either said input terminal or said output of said first amplifier means to said at least one input of said first amplifier means;
   storage capacitor means;
   second switch means for connecting said output of said first amplifier means to said storage capacitor means when said first switch means is connecting said input terminal to said at least one input of said first amplifier means;
   an output terminal connected to said output of said first amplifier means; and,
   second amplifier means having its input connected to said storage capacitor means and its output connected to said at least one input of said first amplifier means.

2. A sample and hold circuit having substantially zero offset voltage error as claimed in claim 1 wherein said first amplifier means is an inverting amplifier and wherein said second amplifier means is a buffer amplifier.

3. A sample and hold circuit having substantially zero offset voltage error as claimed in claim 2 wherein said inverting amplifier is a first operational amplifier having inverting and noninverting inputs, the noninverting input of said first operational amplifier connected to ground and the inverting input of said first operational amplifier connected to said first switch means so as to be connected by said first switch means to either said input terminal or said output of said first operational amplifier.

4. A sample and hold circuit having substantially zero offset voltage error as claimed in claim 3 wherein said buffer amplifier is a second operational amplifier having inverting and noninverting inputs, the noninverting input of said second operational amplifier connected to said capacitor storage means and the output of said second operational amplifier connected to the inverting input of said second operational amplifier, the output of said second operational amplifier also connected to the inverting input of said first operational amplifier.

5. A sample and hold circuit having substantially zero offset voltage error as claimed in claim 4 including a first resistor connected between said first switch means and the inverting input of said first operational amplifier and a second resistor connected between the output of said second operational amplifier and the inverting input of said first operational amplifier.

6. A sample and hold circuit having substantially zero offset voltage error as claimed in claim 5 wherein the resistance value of said first and second resistors is the same.

7. A sample and hold circuit having substantially zero offset voltage error as claimed in claim 5 wherein the resistance value of said first and second resistors is different.

8. A sample and hold circuit having substantially zero offset voltage error as claimed in claim 1 including a first resistor connected between said first switch means and said at least one input of said first amplifier means and a second resistor connected between the output of said second amplifier means and said at least one input of said first amplifier means.

9. A sample and hold circuit having substantially zero offset voltage error as claimed in claim 8 wherein the resistance value of said first and second resistors is the same.

10. A sample and hold circuit having substantially zero offset voltage error as claimed in claim 8 wherein the resistance value of said first and second resistors is different.

* * * * *